May 18, 1965 G. B. HERZOG 3,184,605

PULSE GENERATOR CIRCUITS EMPLOYING STORAGE DIODES

Filed Sept. 21, 1961 2 Sheets-Sheet 1

INVENTOR.
GERALD B. HERZOG
BY Samuel Cohen
ATTORNEY

INVENTOR.
GERALD B. HERZOG
BY [signature]
ATTORNEY

United States Patent Office 3,184,605
Patented May 18, 1965

3,184,605
PULSE GENERATOR CIRCUITS EMPLOYING STORAGE DIODES

Gerald B. Herzog, Princeton, N.J., assignor to Radio Corporation of America, a corporation of Delaware
Filed Sept. 21, 1961, Ser. No. 139,733
10 Claims. (Cl. 307—88.5)

This invention relates to pulse generators.

Many high speed computer circuits and other digital data handling equipment require sources of narrow pulses at fairly high repetition rates. As one example, circuits employing tunnel diodes operated from D.C. power supplies often require narrow reset pulses.

The object of this invention is to provide improved circuits for generating pulses such as described above.

The invention makes use of the storage properties of semiconductor devices such as diodes. An alternating signal is applied to a circuit including a device such as a storage diode. During one portion of the alternating signal the diode conducts heavily and stores charge carriers. The circuit is so arranged that during another portion of the cycle of the input alternating signal, the storage diode discharges its current carriers into the load it is desired to drive, in a very short interval of time. The discharge time of the diode may be arranged to be 10% or less of one period of the alternating current signal.

The invention is described in greater detail below and is illustrated in the following drawings of which:

Figure 1:
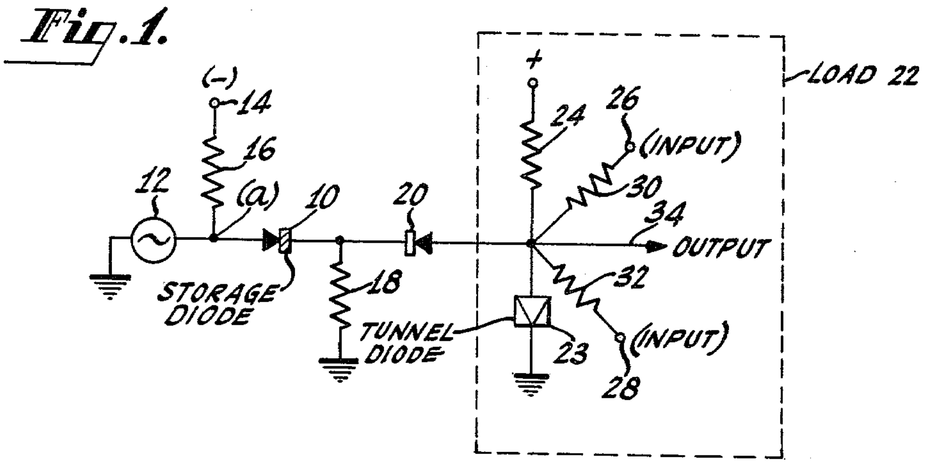
FIG. 1 is a schematic circuit diagram of one embodiment of the invention.
Figure 2:
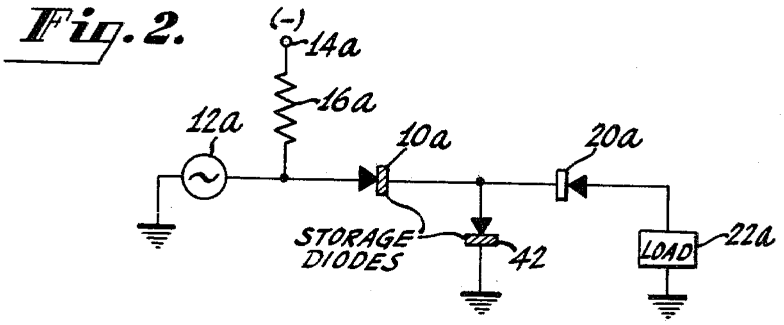
FIG. 2 is a schematic circuit diagram of another embodiment of the present invention.
Figure 3A:
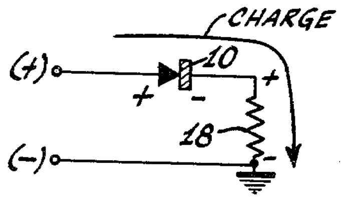
Figure 3B:
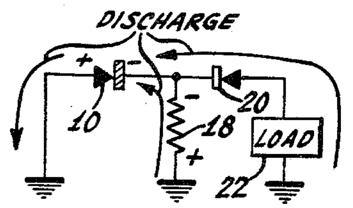
Figure 4:
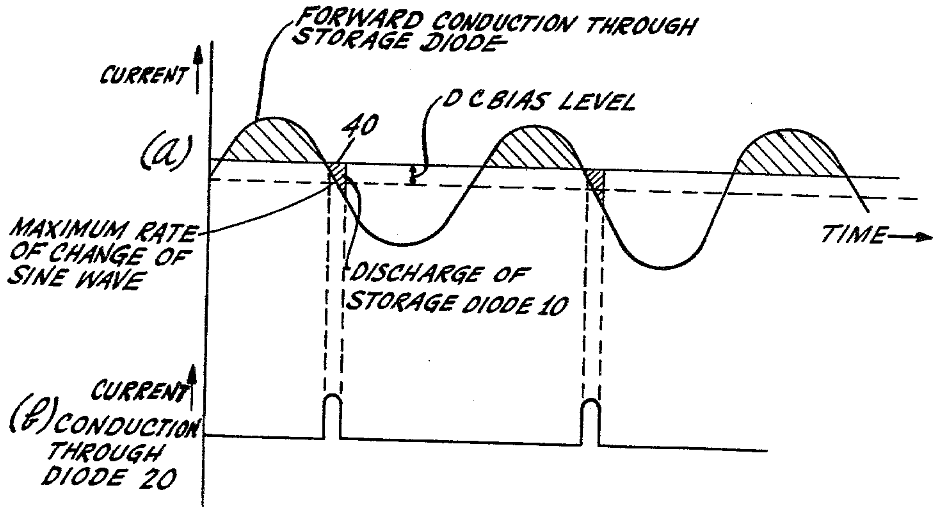
Figure 5:
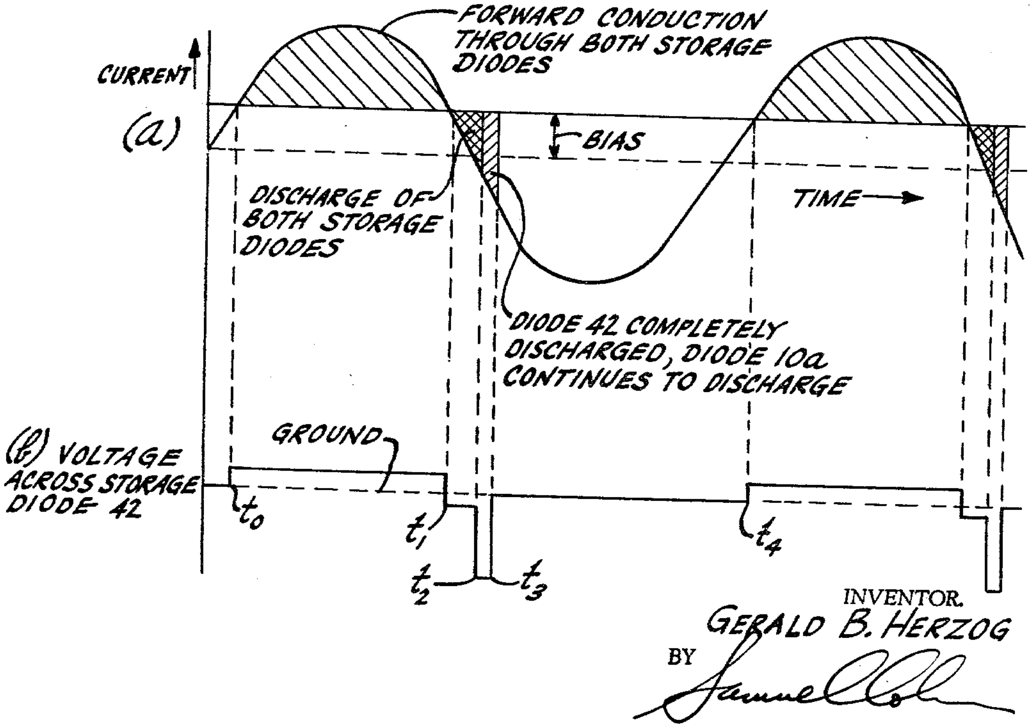

FIGS. 3*a* and 3*b* are equivalent circuits to help explain the operation of the circuit of FIG. 1; and FIGS. 4 and 5 are drawings of waveforms present in the circuits of FIGS. 1 and 2, respectively.

The circuit of FIG. 1 includes a storage diode 10, an alternating current source 12 connected to the diode, and a source of reverse bias current, indicated schematically by the minus sign connected from terminal 14 through resistor 16 to the diode. The cathode of the storage diode is cross-hatched in the figure for purposes of identification. The cathode of the diode is connected to a point of reference potential, shown as ground, through a resistor 18. A high speed conduction diode 20 is connected between the cathode of diode 10 and the load 22.

The load is illustrated as a tunnel diode logic circuit, however, it can be some other type of load. The logic circuit includes a tunnel diode 23 quiescently biased from a current source consisting of a positive voltage source and resistor 24. Inputs may be applied to the tunnel diode from terminals 26 and 28 through resistors 30 and 32. An output is available at lead 34.

The operation of the circuit of FIG. 1 may be better understood by referring to FIGS. 3*a*, 3*b* and 4. The reverse bias voltage normally applied to diode 10 maintains the diode cut off. When the positive swing of the alternating voltage from source 12 exceeds the D.C. bias level, the storage diode 10 begins to conduct as indicated in FIG. 4*a*. During this period, the storage diode 10 accumulates charge carriers. The conduction period of the storage diode 10 may be considered to be analogous to the charge portion of a charge-discharge cycle of circuit operation. This charge portion of the cycle is illustrated in FIG. 3*a*. The polarity of the voltage developed across resistor 18 is such that the conduction diode 20 is reverse biased and does not conduct.

When the instantaneous value of alternating voltage supplied from source 12 decreases to a value insufficient to overcome the D.C. bias applied to the diode 10, the charge carriers accumulated in the diode 10 begin to discharge. The period during which the discharge ("reverse conduction") continues is illustrated by the cross-hatched area 40 in FIG. 4. The equivalent circuit during the discharge interval is shown in FIG. 3*b*. The polarity of the discharge current is such that diode 20 is driven into conduction.

The reverse conduction of storage diode 10 continues only so long as there are stored carriers in diode 10 and hence the current through diode 20 ceases after a very short period, the precise duration of which depends upon the characteristics of the particular storage diode employed. Since this action takes place during the time the sine wave is varying at its maximum rate (see FIG. 4*a*), the build-up of the current through the diode 20 will be very rapid. The decay of current through the diode 20 is also very rapid, the exact time depending on the storage characteristics of the particular diode 10 employed. Decay times of less than ½ nanosecond have been measured.

The waveform of current through the conduction diode 20 is shown in FIG. 4. This current acts as a reset current pulse for the load 22. The polarity of the current is such as to switch the tunnel diode 23 to its low voltage state. The latter is arbitrarily chosen as the reset condition of the tunnel diode.

The circuit of FIG. 2 generates even shorter pulses than the one of FIG. 1. The two circuits are similar except that in the one of FIG. 2 a second storage diode 42 is substituted for the resistor 18 of FIG. 1. The second storage diode 42 is chosen to have a shorter recovery time (it is capable of storing fewer charge carriers in response to a given conduction current through the diode) than the first storage diode 10*a*.

The operation of the circuit of FIG. 2 is depicted in FIG. 5. During the time the alternating voltage supplied from source 12*a* exceeds the reverse bias voltage applied to terminal 14*a*, both storage diodes 10*a* and 42 conduct in the forward direction. The voltage developed across storage diode 42 during the time it conducts is relatively small and is in the reverse direction with respect to conduction diode 20*a*. Accordingly, during the time the second storage diode 42 conducts in the forward direction, conduction diode 20*a* is cut off.

When the instantaneous voltage output of source 12*a* reaches a value less than that provided by the negative bias source, the storage diodes 10*a* and 42 both begin to discharge the carriers they have stored. As already mentioned, second storage diode 42 is capable of storing fewer charge carriers than first storage diode 10*a* and, accordingly, its stored charge becomes exhausted before the charge stored in the first storage diode 10*a* becomes exhausted. When the charge carriers stored in second storage diode 42 become exhausted, this diode acts like a high value of impedance and the charge carriers which continue to be discharged from first storage diode 10*a* produce a reverse bias voltage across the second storage diode 42. This reverse bias voltage is in the forward direction with respect to conduction diode 20*a* and the latter begins to conduct heavily.

The voltage across the second storage diode 42 is shown in FIG. 5*b*. During the interval $t_0$ to $t_1$ the forward current from source 12*a* passes through second storage diode 42. The voltage drop across this diode is relatively small. During the period $t_1$ to $t_2$, the discharge circuit includes storage diodes 10*a* and 42 and second storage diode 42 is discharging its stored carriers. Reverse conduction occurs through second storage diode 42, however, the voltage drop across the diode 42 is relatively small since its impedance is relatively low. Conduction diode 20*a* is slightly forward biased but not to an extent sufficient to cause any appreciable amount of conduction through diode 20$a$. During the interval $t_2$ to $t_3$ the carriers have been exhausted from second storage diode 42; however, the first storage diode 10$a$ continues to discharge its carriers. The voltage across second storage diode 42 now reaches a relatively large value in the reverse direction as diode 42 acts like a high value of resistance. This high, reverse voltage provides a flow of current through conduction diode 20$a$ to the load 22$a$.

As can be seen from the figures, the duration of the voltage pulse produced by the circuit of FIG. 2 is substantially smaller than the one produced by the circuit of FIG. 1. Here, too, the fact that the storage diodes 10$a$ and 42 conduct during the portion of the sine wave at or close to its maximum rate of change is advantageous in that it reduces the duration of the pulse produced by the circuit. Typical circuits according to the present invention may employ the following components. These values are merely illustrative and are not meant to be limiting.

Figure 1:
- Source 12—100 megacycles, 3 volt peak
- Resistor 16—100 ohms
- Resistor 18—200 ohms
- Diode 10—FD 100 or 1N696
- Diode 20—HD 5000
- Reverse bias voltage applied to terminal 14—1 volt Figure 2:
- Source 12$a$—100 megacycles, 3 volt peak
- Resistor 16$a$—100 ohms
- Diode 10$a$—FD 100 } Selected units for proper storage
- Diode 42—FD 100 }
- Reverse bias voltage applied to terminal 14$a$—1 volt

What is claimed is:

1. In combination, a first active element which stores charge carriers; a second active element which stores charge carriers connected in series anode-to-cathode with the first active element; means for applying a sinusoidal voltage to the series circuit of said two active elements at a level to produce conduction through the two active elements; and an output circuit connected to the first active element, said circuit including an asymmetrically conducting element poled to conduct in its easier direction of current flow in response to the discharge of carriers by said second active element during a period after the carriers in the first active element have become exhausted.

2. In combination, a load element; an active element which stores charge carriers connected in series with the load element; means for applying a sinusoidal electrical wave to the series circuit of said active and load element; means for applying a reverse bias direct voltage to said series circuit at a level such that the active element conducts and stores charge carriers during one portion of the cycle of the sinusoidal wave and then tends to discharge its stored charge carriers during the portion of the sinusoidal wave at which the rate of change of voltage is greatest; and an output circuit connected to the load element, said output circuit including an asymmetrically conducting element poled to conduct in its easier direction of current flow in response to the discharge carriers by said active element.

3. In combination, a resistor; a diode which stores charge carriers connected in series with the resistor; means for applying a sinusoidal electrical wave to the series circuit of said resistor and diode; means for applying a reverse bias direct voltage to said series circuit at a level such that the diode conducts and stores charge carriers during one portion of the cycle of the sinusoidal wave and discharges its stored charge carriers during the portion of the sinusoidal wave at which the rate of change of voltage is greatest; and an output circuit connected to the resistor, said output circuit including a diode poled to be cut off by the voltage developed across the resistor when the storage diode conducts in the forward direction and to conduct in its easier direction of current flow in response to the discharge of carriers by said storage diode.

4. In combination, a first diode which stores charge carriers; a second diode which stores charge carriers connected in series in the forward direction with the first diode, the second diode having a smaller carrier storage capacity than the first diode; means for applying a sinusoidal electrical wave to the series circuit of said two diodes; means for applying a reverse bias direct voltage to said series circuit at a level such that the diodes conduct and store charge carriers during one portion of the cycle of the sinusoidal wave and then discharge their stored charge carriers during a portion of the sinusoidal wave at which the rate of change of voltage is great; and an output circuit connected to the second diode, said circuit including a third diode poled to be cut off during forward conduction through the first and second diodes and to conduct in the forward direction in response to the build-up of a substantial reverse voltage across the second diode due to the discharge of carriers by the first diode.

5. A pulse generating circuit comprising, in combination,
- a storage diode which, when driven in the forward direction, stores charge carriers and, when the voltage across it is reversed, first conducts relatively heavily in the reverse direction discharging the stored carriers and, when the carriers have been depleted, changes its conductance to substantially zero, the change in conductance requiring not more than several nanoseconds;
- power supply means for applying an alternating current to the diode for driving the diode into and out of conduction;
- a load for receiving the charge carriers discharged by said storage diode; and
- a discharge circuit connected to the diode, said discharge circuit including an asymmetrically conducting element connected at one terminal to said load and at its other terminal through the storage diode to said power supply means in a sense to be reverse biased when the power supply supplies a current in the forward direction to the storage diode, and forward biased in response to the discharge of charge carriers from said storage diode.

6. A pulse generating circuit comprising, in combination,
- a storage diode which, when driven in the forward direction, stores charge carriers and, when the voltage across it is reversed, first conducts relatively heavily in the reverse direction discharging the stored carriers and, when the carriers have been depleted, changes its conductance to substantially zero, the change in conductance requiring not more than several nanseconds;
- means for applying a sinusoidal current to the diode for driving the diode into and out of conduction; and
- a discharge circuit connected to the diode, said discharge circuit including in one branch an asymmetrically conducting element connected to the storage diode in the sense to be reverse biased in response to current flow in the forward direction through the storage diode, and forward biased in response to the discharge of charge carriers from said storage diode, and in another branch a second storage diode like the first mentioned diode but having a smaller charge carrier storage capacity than the first diode.

7. In combination,
- a storage diode which, when driven in the forward direction, stores charge carriers and, when the voltage across it is reversed, first conducts relatively heavily in the reverse direction discharging the stored carriers and, when the carriers have been depleted, changes its conductance to substantially zero, the change in conductance requiring not more than several nanoseconds;

a tunnel diode;

means coupled to the storage diode for producing forward conduction through the diode and causing it to store charge carriers; and a discharge circuit for said storage diode, said discharge circuit including said tunnel diode, for receiving the discharged charge carriers from said storage diode.

8. In combination, a storage diode which, when driven in the forward direction, stores charge carriers and, when the voltage across it is reversed, first conducts relatively heavily in the reverse direction discharging the stored carriers and, when the carriers have been depleted, changes its conductance to substantially zero, the change in conductance requiring not more than several nanoseconds;

a bistably biased tunnel diode coupled to said storage diode;

means coupled to the storage diode for producing forward conduction through the diode and causing it to store charge carriers; and a discharge circuit for said storage diode, said discharge circuit including said tunnel diode, for receiving the discharged stored carriers from said storage diode for changing the state of the tunnel diode.

9. In combination, a storage diode which, when driven in the forward direction, stores charge carriers and, when the voltage across it is reversed, first conducts relatively heavily in the reverse direction discharging the stored carriers, and when the carriers have been depleted, changes its conductance to substantially zero, the change in conductance requiring not more than several nanoseconds;

means coupled to the storage diode for producing forward conduction through the diode and causing it to store charge carriers; and a tunnel diode coupled to the storage diode for receiving the charge carriers discharged by the storage diode.

10. In combination, a storage diode which, when driven in the forward direction, stores charge carriers and, when the voltage across it is reversed, first conducts relatively heavily in the reverse direction discharging the stored carriers, and when the carriers have been depleted, changes its conductance to substantially zero, the change in conductance requiring not more than several nanoseconds;

means coupled to the storage diode for producing forward conduction through the diode and causing it to store charge carriers;

a high speed, positive resistance diode; and a tunnel diode coupled to the storage diode through the high speed positive resistance diode for receiving the charge carriers discharged by the storage diode.

References Cited by the Examiner

UNITED STATES PATENTS 2,997,659 8/61 Abbott et al. ---------- 307—88.5

OTHER REFERENCES

RCA Technical Notes "Sharp Threshold Gate," E. L. Willette, RCA TN No. 428, January 1961.

JOHN W. HUCKERT, *Primary Examiner.*